(12) United States Patent
Roh (10) Patent No.: US 9,418,880 B2
(45) Date of Patent: Aug. 16, 2016

(54) APPARATUSES AND METHODS FOR TREATING SUBSTRATE

(75) Inventor: Jaemin Roh, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 237 days.

(21) Appl. No.: 13/535,017

(22) Filed: Jun. 27, 2012

(65) Prior Publication Data

US 2013/0001194 A1 Jan. 3, 2013

(30) Foreign Application Priority Data

Jun. 30, 2011 (KR) .................. 10-2011-0064996
Oct. 6, 2011 (KR) .................. 10-2011-0101968

(51) Int. Cl.
| | |
|---|---|
| *C23C 16/448* | (2006.01) |
| *C23C 16/455* | (2006.01) |
| *C23C 16/54* | (2006.01) |
| *H01L 21/67* | (2006.01) |
| *H01J 37/32* | (2006.01) |

(52) U.S. Cl.
CPC ..... *H01L 21/67126* (2013.01); *H01J 37/32834* (2013.01); *H01L 21/6719* (2013.01); *H01L 21/67069* (2013.01)

(58) Field of Classification Search
CPC .............. H01L 21/67126; H01L 21/6719; H01L 21/67069; H01J 37/32834; C23C 14/24; C23C 14/243; C23C 14/56; C23C 14/562; C23C 14/568; C23C 16/4485; C23C 16/45548; C23C 16/45551; C23C 16/54; C23C 16/545
USPC ..................... 118/715; 156/345.29
See application file for complete search history.

(56) References Cited

U.S. PATENT DOCUMENTS

| | | | | | |
|---|---|---|---|---|---|
| 4,259,147 | A | * | 3/1981 | Gordy | ........................ C05C 3/00 162/12 |
| 4,259,151 | A | * | 3/1981 | Gordy | ....................... D21C 7/00 162/239 |
| 4,360,319 | A | * | 11/1982 | Paget | ......................... F04B 5/02 137/512.15 |
| 5,415,378 | A | * | 5/1995 | Craven | ..................... E21B 34/02 251/31 |
| 5,611,863 | A | * | 3/1997 | Miyagi | ................ C23C 16/4405 118/723 E |
| 5,891,350 | A | * | 4/1999 | Shan | .................. H01J 37/32477 118/723 E |

(Continued)

FOREIGN PATENT DOCUMENTS

| | | | |
|---|---|---|---|
| JP | 11051207 A | * | 2/1999 |
| JP | 2009-287582 | | 12/2009 |

(Continued)

OTHER PUBLICATIONS

Chinese Notice of Allowance for Application No. 201210227046.8 dated Apr. 5, 2016.

*Primary Examiner* — Rudy Zervigon
(74) *Attorney, Agent, or Firm* — Jenkins, Wilson, Taylor & Hunt, P.A.

(57) ABSTRACT

Provided is a substrate treating apparatus, which includes a process chamber providing a space in which a substrate is treated, an exhausting pipe connected to the process chamber, and providing a passage through which gas is discharged from the process chamber to an outside thereof, a pump installed on the exhausting pipe, and a valve installed on the exhausting pipe between the process chamber and the pump, and opening and closing the passage. The valve includes a first plate provided with exhausting holes, and a first driver moving the first plate such that the exhausting holes are located within the passage or outside the passage.

9 Claims, 7 Drawing Sheets

(56) References Cited

U.S. PATENT DOCUMENTS

| | | | | |
|---|---|---|---|---|
| 5,971,604 | A * | 10/1999 | Linga | B01F 15/0429 137/625.3 |
| 6,010,115 | A * | 1/2000 | Schlegel | F16K 3/0227 251/327 |
| 6,080,679 | A * | 6/2000 | Suzuki | C23C 114/564 118/715 |
| 6,261,408 | B1 * | 7/2001 | Schneider | C23C 16/4412 118/715 |
| 6,652,711 | B2 * | 11/2003 | Brcka | H01J 37/3244 118/723 AN |
| 7,109,660 | B2 * | 9/2006 | Ishihara | H01J 37/32834 315/111.11 |
| 7,416,677 | B2 * | 8/2008 | Takahashi | H01J 37/32844 156/345.47 |
| 7,927,066 | B2 * | 4/2011 | Moriya | F04D 19/042 415/121.1 |
| 8,012,305 | B2 * | 9/2011 | Takahashi | H01J 37/32844 118/115 |
| 8,142,567 | B2 * | 3/2012 | Kobayashi | C23C 16/4412 118/715 |
| 8,158,068 | B2 * | 4/2012 | Park | H01J 37/32623 422/186 |
| 8,236,105 | B2 * | 8/2012 | Bera | C23C 16/4412 118/715 |
| 8,382,939 | B2 * | 2/2013 | Kutney | H01J 37/3244 118/50 |
| 8,398,814 | B2 * | 3/2013 | Balakrishna | C23C 16/4412 118/715 |
| 8,771,417 | B2 * | 7/2014 | Yoon | H01J 37/32357 118/715 |
| 9,091,351 | B2 * | 7/2015 | DeOcampo | F16K 3/0254 |
| 2002/0038791 | A1 * | 4/2002 | Okumura | C23C 16/4412 216/71 |
| 2002/0088542 | A1 * | 7/2002 | Nishikawa | H01J 37/3244 156/345.29 |
| 2004/0129218 | A1 * | 7/2004 | Takahashi | H01J 37/32834 118/715 |
| 2004/0182440 | A1 * | 9/2004 | Watts | F16K 11/052 137/375 |
| 2005/0167052 | A1 * | 8/2005 | Ishihara | H01J 37/32834 156/345.47 |
| 2006/0257243 | A1 * | 11/2006 | Moriya | F04D 19/042 415/90 |
| 2008/0035605 | A1 * | 2/2008 | Takahashi | H01J 37/32844 216/58 |
| 2008/0173836 | A1 * | 7/2008 | Chern | F16K 3/02 251/129.1 |
| 2008/0295964 | A1 * | 12/2008 | Takahashi | H01J 37/32844 156/345.28 |
| 2009/0008369 | A1 * | 1/2009 | Nozawa | C23C 16/4412 219/121.54 |
| 2009/0120464 | A1 * | 5/2009 | Rasheed | C23C 16/4412 134/21 |
| 2010/0175622 | A1 * | 7/2010 | Yoon | H01J 37/321 118/723 R |
| 2010/0206231 | A1 * | 8/2010 | Yoon | H01J 37/32357 118/723 I |
| 2011/0021034 | A1 * | 1/2011 | Yang | C23C 16/45591 438/758 |
| 2011/0162678 | A1 * | 7/2011 | Moriya | F04D 19/042 134/21 |
| 2011/0305836 | A1 * | 12/2011 | Murata | C23C 16/45544 427/255.28 |
| 2012/0000886 | A1 * | 1/2012 | Honda | H01J 37/18 216/24 |
| 2012/0111427 | A1 * | 5/2012 | Nozawa | C23C 16/4412 137/511 |
| 2012/0132619 | A1 * | 5/2012 | Matsuda | C23C 16/4412 216/67 |
| 2013/0126153 | A1 * | 5/2013 | Baker | E21B 33/06 166/55 |

FOREIGN PATENT DOCUMENTS

| | | |
|---|---|---|
| JP | 2010-114119 | 5/2010 |
| JP | 2010-112391 A | 5/2012 |
| KR | 10-2007-101450 A | 10/2007 |
| KR | 10-0819160 B | 3/2008 |
| KR | 10-1085191 B1 | 11/2011 |

* cited by examiner

APPARATUSES AND METHODS FOR TREATING SUBSTRATE

CROSS-REFERENCE TO RELATED APPLICATIONS

This application claims priority under 35 U.S.C. §119 to Korean Patent Application Nos. 10-2011-0064996, filed on Jun. 30, 2011, and 10-2011-0101968, filed on Oct. 6, 2011, the entireties of which are both hereby incorporated by reference.

BACKGROUND OF THE INVENTION

The present invention disclosed herein relates to an apparatus for treating a substrate, and more particularly, to an apparatus for adjusting the inner pressure of a process chamber.

Semiconductor fabrication processes are performed in a process chamber. At this point, the inner pressure of the process chamber is controlled to predetermined pressure by a pump that is installed on an exhausting pipe. To this end, opening/closing operations of a valve installed on the exhausting pipe are controlled.

Figure 1:
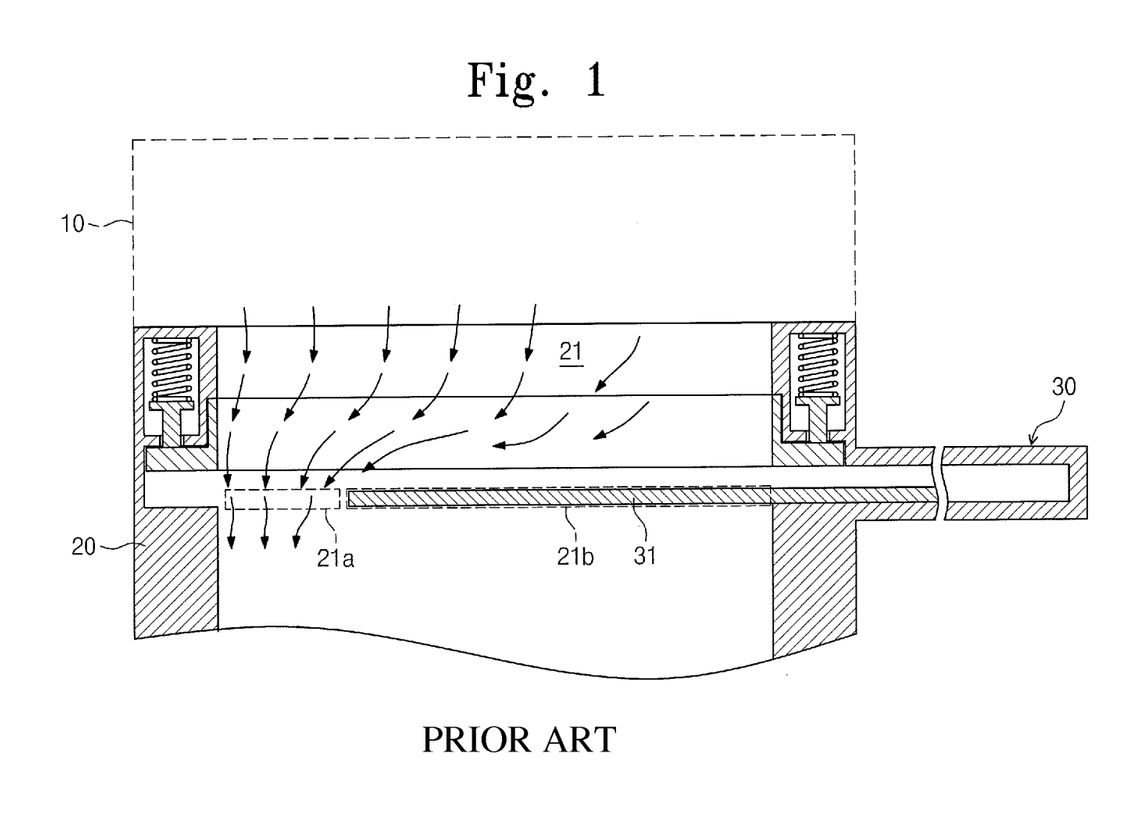
FIG. 1 is a cross-sectional view illustrating a state that a valve opens a passage of an exhausting pipe in the related art.

Referring to FIG. 1, a valve 30 moves a plate 31 installed within an exhausting pipe 20 to thereby adjusting the inner pressure of a process chamber 10. The plate 31 may open at least one portion of a passage 21 of the exhausting pipe 20 according to process pressure conditions.

When the plate 31 opens a portion of the passage 21, gas flows through only an open region 21a of the passage 21, and is prevented from flowing through a closed region 21b of the passage 21 by the plate 31. Accordingly, the flow of gas discharged from the process chamber 10 is biased to the open region 21a, whereby gas discharged from the process chamber 10 is biased to the open region 21a, whereby gas within the process chamber 10 unevenly flows. The uneven flow of the gas varies a treated result of a substrate placed within the process chamber 10, according to regions on the substrate.

SUMMARY OF THE INVENTION

The present invention provides an apparatus for uniformly treating a substrate.

Embodiments of the present invention provide substrate treating apparatuses including: a process chamber providing a space in which a substrate is treated; an exhausting pipe connected to the process chamber, and providing a passage through which gas is discharged from the process chamber to an outside thereof; a pump installed on the exhausting pipe; and a valve installed on the exhausting pipe between the process chamber and the pump, and opening and closing the passage, wherein the valve includes: a first plate provided with exhausting holes; and a first driver moving the first plate such that the exhausting holes are located within the passage or outside the passage.

In some embodiments, the first plate may include: an opening region in which the exhausting holes are disposed to pass the gas; and a closing region extending from the opening region, and blocking a flow of the gas within the passage of the exhausting pipe, wherein the closing region has an area greater than that of the passage.

In other embodiments, the opening region may have an area smaller than that of the passage.

In still other embodiments, the valve may further include a second plate that is disposed within the exhausting pipe between the process chamber and the first plate, and that opens and closes the passage, wherein the exhausting holes are not disposed in the second plate.

In even other embodiments, the first plate may include an opening region having an area corresponding to the passage, and the exhausting holes may be uniformly distributed in the opening region.

In other embodiments of the present invention, substrate treating methods include: supplying gas into a process chamber to treat a substrate; and discharging the gas from the process chamber to an outside thereof through an exhausting pipe connected to the process chamber, wherein the discharged gas passes through exhausting holes of a first plate disposed within a passage of the exhausting pipe.

In some embodiments, the first plate may include an opening region provided with the exhausting holes, and having an area smaller than that of the passage, wherein while the gas is discharged, the opening region is located within the passage, and a portion of the discharged gas flows through the exhausting holes.

In other embodiments, before the gas is supplied into the process chamber, the exhausting pipe may be closed by locating a closing region of the first plate within the passage, wherein the closing region has an area greater than that of the passage, and the exhausting holes are not disposed in the closing region.

In still other embodiments, a second plate may be disposed within the exhausting pipe between the first plate and the process chamber to open and close the passage, wherein the second plate opens the passage while the gas is discharged, and the second plate closes the passage before the gas is supplied into the process chamber.

In even other embodiments, the first plate may include an opening region provided with the exhausting holes and having an area corresponding to the passage, wherein while the gas is discharged, the opening region is located with the passage.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Hereinafter, apparatuses and methods for treating a substrate according to preferred embodiments of the present invention will be described in detail with reference to the accompanying drawings. Detailed descriptions related to well-known functions or configurations will be ruled out in order not to unnecessarily obscure subject matters of the present invention.

Figure 2:
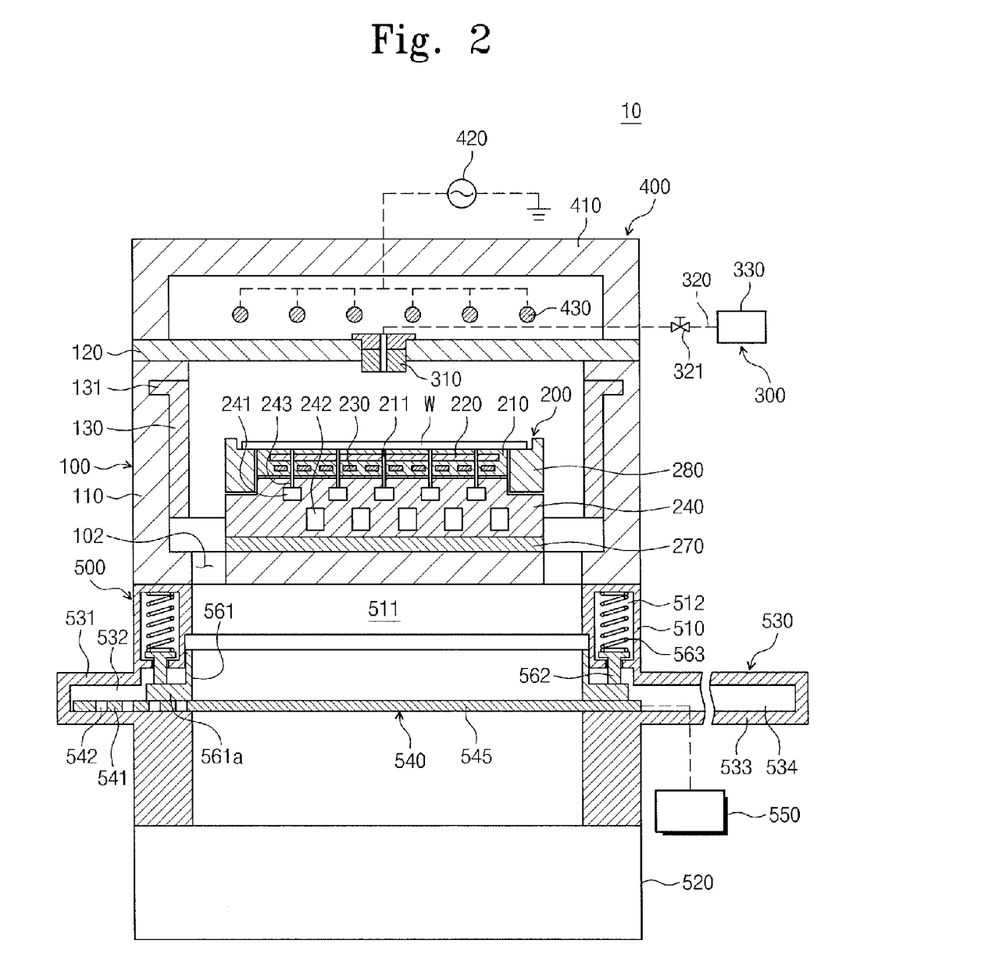
FIG. 2 is a cross-sectional view illustrating a substrate treating apparatus according to an embodiment of the present invention.

FIG. 2 is a cross-sectional view illustrating a substrate treating apparatus according to an embodiment of the present invention.

Referring to FIG. 2, a substrate treating apparatus 10 according to the current embodiment treats a substrate W by using plasma. The substrate treating apparatus 10 includes a process chamber 100, a substrate support part 200, a gas supply part 300, a plasma generation part 400, and an exhausting member 500.

The process chamber 100 provides a space in which the substrate W is treated. The process chamber 100 includes a body 110, a sealing cover 120, and a liner 130.

The body 110 includes an inner space with an upper opening. The inner space of the body 110 functions as a space for treating the substrate W. The body 110 is formed of a metal. The body 110 may be formed of aluminum. An exhausting hole 102 is disposed in the bottom of the body 110. The exhausting hole 102 functions as a passage through which gas staying within the body 110, and reaction by-products generated during a substrate treating process are discharged to the outside of the body 110.

The sealing cover 120 covers the upper opening of the body 110. The sealing cover 120 has a plate shape, and seals the inner space of the body 110. The sealing cover 120 may be formed of a material different from that of the body 110. The sealing cover 120 may be formed of a dielectric substance.

The liner 130 is disposed within the body 110. The liner 130 includes an inner space with upper and lower openings. The liner 130 may have a cylindrical shape. The liner 130 may have a radius corresponding to an inner surface of the body 110. The liner 130 extends along the inner surface of the body 110. A support ring 131 is disposed at the upper end of the liner 130. The support ring 131 has a ring plate shape around the liner 130, and protrudes outward therefrom. The support ring 131 is placed on the upper end of the body 110, and supports the liner 130. The liner 130 and the body 110 may be formed of the same material. The liner 130 may be formed of aluminum. The liner 130 protects the inner surface of the body 110. When a process gas is excited, an arc discharge may occur within the process chamber 100. The arc discharge may damage peripheral devices. The liner 130 protects the inner surface of the body 110 from arc discharges. The liner 130 is lower in price than the body 110, and can be easily replaced. Thus, when the liner 130 is damaged by an arc discharge, the liner 130 can be replaced with a new one.

The substrate support part 200 is disposed within the body 110. The substrate support part 200 supports the substrate W. The substrate support part 200 includes an electrostatic chuck holding the substrate W by using an electrostatic force.

The electrostatic chuck (also denoted by 200) includes a dielectric plate 210, a lower electrode 220, a heater 230, a support plate 240, and an insulation plate 270.

The dielectric plate 210 is disposed in the upper end of the electrostatic chuck 200. The dielectric plate 210 is provided in a disc-shaped dielectric substance. The substrate W is placed on the top surface of the dielectric plate 210. The top surface of the dielectric plate 210 has a radius smaller than that of the substrate W. As a result, the edge of the substrate W is positioned outside the dielectric plate 210. First supply channels 211 are formed in the dielectric plate 210. The first supply channels 211 extend from the top surface of the dielectric plate 210 to the bottom surface thereof. The first supply channels 211 are spaced apart from one another, and are provided as paths for supplying a heat transfer medium to the bottom surface of the substrate W.

The lower electrode 220 and the heater 230 are embedded in the dielectric plate 210. The lower electrode 220 is positioned above the heater 230. The lower electrode 220 is electrically connected to an external power source (not shown). The external power source includes a DC power source. Electric force acts between the lower electrode 220 and the substrate W according to direct current applied to the lower electrode 220, and the substrate W is attached to the dielectric plate 210 by the electric force.

The heater 230 is electrically connected to an external power source (not shown). The heater 230 generates heat by resisting electric current provided from the external power source. The generated heat is transferred to the substrate W through the dielectric plate 210. The substrate W is maintained at a predetermined temperature by the heat generated from the heater 230. The heater 230 includes a spiral coil. The heater 230 may be embedded with a constant interval in the dielectric plate 210.

The support plate 240 is positioned under the dielectric plate 210. The bottom surface of the dielectric plate 210 and the top surface of the support plate 240 may be adhered to each other by an adhesive 236. The support plate 240 may be formed of an aluminum material. The top surface of the support plate 240 may have a stepped shape with a center region higher than an edge region. The top center region of the support plate 240 has an area corresponding to that of the bottom surface of the dielectric plate 210, and is adhered thereto. A first circulation channel 241, a second circulation channel 242, and a second supply channel 243 are formed in the support plate 240.

The first circulation channel 241 is provided as a path for circulating the heat transfer medium. The first circulation channel 241 may be formed in a spiral shape within the support plate 240. Alternatively, the first circulation channel 241 may be provided in plurality as ring-shaped channels having concentric circles with different radii. In this case, the first circulation channels 241 may communicate with one another. The first circulation channels 241 are formed at the same height.

The second supply channel 243 extends upward from the first circulation channel 241, and arrives at the top surface of the support plate 240. The number of second supply channels 243 corresponds to the number of the first supply channels 211. The second supply channels 243 connect the first circulation channels 241 to the first supply channels 211. The heat transfer medium circulating through the first circulation channel 241 sequentially passes through the second supply channels 243 and the first supply channels 211, and is then supplied to the bottom surface of the substrate W. The heat transfer medium functions as a medium whereby the heat transferred from the plasma to the substrate W is transferred to the electrostatic chuck 200. Ion particles contained in the plasma are attracted by electric force formed at the electrostatic chuck 200, and are moved to the electrostatic chuck 200. At this point, the ion particles collide with the substrate W to perform an etching process. While the ion particles collide with the substrate W, heat is generated in the substrate W. The heat generated in the substrate W is transferred to the electrostatic chuck 200 through heat transfer gas supplied to a space between the bottom surface of the substrate W and the top surface of the dielectric plate 210. Accordingly, the substrate W can be maintained at a set temperature. The heat transfer medium includes inert gas. According to an embodiment of the present invention, the heat transfer medium includes helium (He) gas.

The second circulation channel 242 is provided as a path for circulating a cooling fluid. The cooling fluid circulates along the second circulation channel 242, and cools the support plate 240. The cooling of the support plate 240 maintains the substrate W at a predetermined temperature by cooling the dielectric plate 210 and the substrate W together. The second circulation channel 242 may be formed in a spiral shape within the support plate 240. Alternatively, the second circulation channel 242 may be provided in plurality as ring-shaped channels having concentric circles with different radii. In this case, the second circulation channels 242 may communicate with one another. The second circulation channel 242 may have a cross-sectional area greater than that of the first circulation channel 241. The second circulation channels 242 are formed at the same height. The second circulation channel 242 may be positioned under the first circulation channel 241.

The insulation plate 270 is provided under the support plate 240. The insulation plate 270 is provided in a size corresponding to that of the support plate 240. The insulation plate 270 is positioned between the support plate 240 and a bottom surface of the process chamber 100. The insulation plate 270 is formed of an insulation material, and electrically insulates the support plate 240 and the process chamber 100 from each other.

A focus ring 280 is disposed at an edge region of the electrostatic chuck 200. The focus ring 200 has a ring shape, and is disposed around the dielectric plate 210. The top surface of the focus ring 280 may have a stepped shape in which an inside portion thereof adjacent to the dielectric plate 210 is lower than an outside portion thereof. The inside portion of the focus ring 280 is positioned at the same height as that of the top surface of the dielectric plate 210. The inside portion of the focus ring 280 supports the edge region of the substrate W at the outside of the dielectric plate 210. The outside portion of the focus ring 280 surrounds the edge region of the substrate W. The focus ring 280 expands an electric field formation region such that the substrate W is positioned at the center region of the plasma. Accordingly, the plasma is uniformly formed over the entire region of the substrate W, and thus, the entire region of the substrate W can be uniformly etched.

The gas supply part 300 supplies a process gas into the process chamber 100. The gas supply part 300 includes a gas supply nozzle 310, a gas supply line 320, and a gas storage part 330. The gas supply nozzle 310 is disposed in the central portion of the sealing cover 120. An injection hole is formed in the bottom of the gas supply nozzle 310. The injection hole is disposed under the sealing cover 120, and supplies the process gas into the process chamber 100. The gas supply line 320 connects the gas supply nozzle 310 and the gas storage part 330 to each other. The gas supply line 320 supplies the process gas from the gas storage part 330 to the gas supply nozzle 310. A valve 321 is installed on the gas supply line 320. The valve 321 opens and closes the gas supply line 320, and controls the flow rate of the process gas supplied through the gas supply line 320.

The plasma generation part 400 supplies high frequency power into the process chamber 100 to excite the process gas therein. The plasma generation part 400 includes a housing 410, an upper power source 420, and an antenna 430.

The housing 410 has an open bottom, and includes an inner space. The housing 410 is disposed above the sealing cover 120, and is placed on the top surface thereof. The antenna 430 is disposed in the inner space of the housing 410. The upper power source 420 generates high frequency current. The generated high frequency current is applied to the antenna 430. The antenna 430 supplies high frequency power into the process chamber 100. The antenna 430 may include ring-shaped coils having concentric circles with different radii.

A process gas (hereinafter, referred to as gas) staying within the process chamber 100, and reaction by-products generated during the substrate treating process are discharged to the outside of the process chamber 100 by the exhausting member 500. The exhausting member 500 includes an exhausting pipe 510, a pump 520, and a valve 530.

The exhausting pipe 510 is disposed under the process chamber 100, and is connected to the lower end thereof. The exhausting pipe 510 includes a passage 511 therein, and the passage 511 is connected to the inside of the process chamber 100. The pump 520 is installed on the exhausting pipe 510. The pump 520 controls the inner pressure of the process chamber 100 through the exhausting pipe 510. While the substrate W is treated in the process chamber 100, the pump 520 may decrease the inner pressure of the process chamber 100 to below the atmospheric pressure.

The valve 530 is disposed between the exhausting pipe 510 and the pump 520. The valve 530 opens and closes the passage 511 of the exhausting pipe 510. The valve 530 adjusts the degree of opening of the passage 511 to thereby adjust the flow rate of a fluid discharged through the exhausting pipe 510. The inner pressure of the process chamber 100 may be adjusted by adjusting the flow rate of the discharged fluid. The valve 530 includes a first accommodating part 531, a second accommodating part 533, a plate 540, a driver 550, and a plurality of sealing members 561, 562, and 563.

The first accommodating part 531 is disposed at a side of the exhausting pipe 510. A first accommodating space 532 is disposed within the first accommodating part 531. The first accommodating space 532 is connected to the passage 511 of the exhausting pipe 510. The second accommodating part 533 is disposed at another side of the exhausting pipe 510. The second accommodating part 533 is symmetrical to the first accommodating part 531 with respect to the exhausting pipe 510. A second accommodating space 534 is disposed within the second accommodating part 533. The second accommodating space 534 is connected to the passage 511 of the exhausting pipe 510. The first and second accommodating spaces 532 and 534 provide a space to allow movement of the plate 540.

Figure 3:
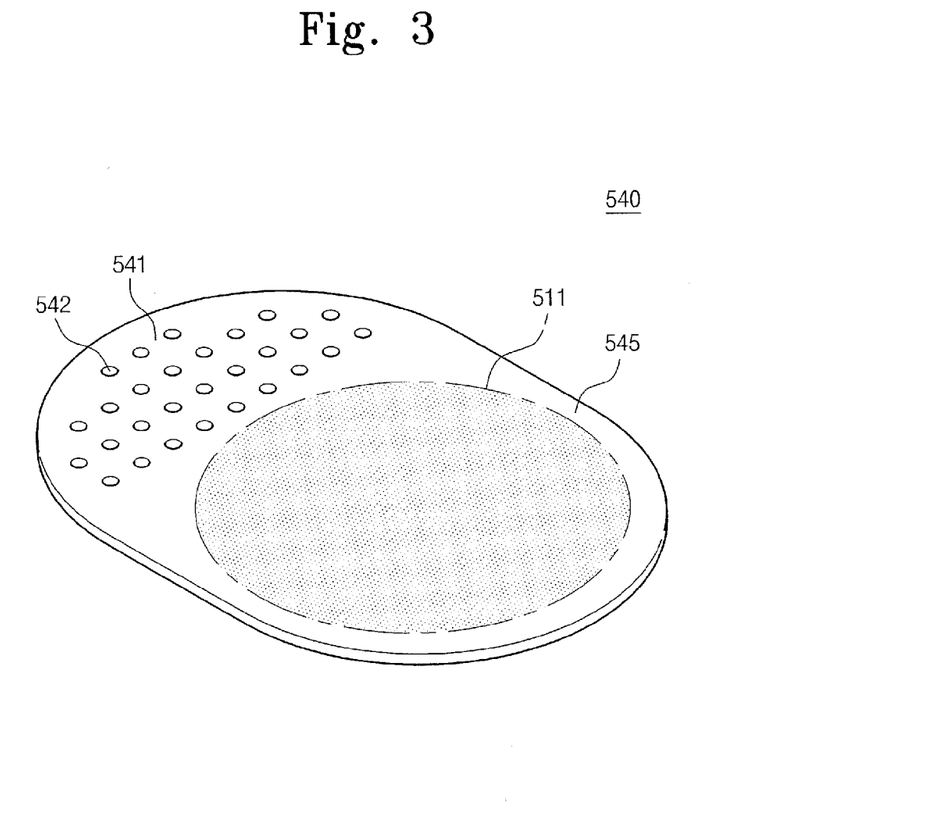
FIG. 3 is a perspective view illustrating a plate of FIG. 2.

The plate 540 is disposed in the second accommodating space 534. Referring to FIG. 3, the plate 540 has an approximately disk shape, and adjusts the degree of opening of the passage 511. The plate 540 has an area greater than that of the passage 511. The plate 540 includes an opening region 541 and a closing region 545. The opening region 541 is adjacent to the front end of the plate 540, and may have an area smaller than that of the passage 511. Exhausting holes 542 are disposed in the opening region 541. The exhausting holes 542 function as a passage to allow gas to flow through the exhausting pipe 510. The closing region 545 extends from the opening region 541, and has an area greater than that of the passage 511. The exhausting holes 542 are disposed out of the closing region 545. The closing region 545 may block a gas flow within the passage 511.

The driver 550 moves the plate 540 within the first and second accommodating spaces 532 and 534. The driver 550 may move the plate 540 such that the opening region 541 is located within the first accommodating space 532, and the closing region 545 is located within the passage 511. The driver 550 may move the plate 540 such that the opening region 541 is located within the passage 511, and the closing region 545 is located within the second accommodating space 534. The driver 550 may straightly move the plate 540 back and forth. Alternatively, the driver 550 may rotate the plate 540 about a rotation shaft eccentric from the center of the plate 540.

While the plate 540 closes the passage 511, the sealing members 561, 562, and 563 prevent the leak of exhaust gas. The sealing members 561, 562, and 563 include a sealing ring 561, a plurality of driving rods 562, and a plurality of elastic members 563.

The sealing ring 561 has a ring shape, and is disposed within the passage 511. The sealing ring 561 has a radius corresponding to the passage 511, and is disposed above the plate 540. A protrusion 561a is disposed on the outer surface of the sealing ring 561. The protrusion 561a extends around the sealing ring 561. The driving rods 562 are disposed in an accommodating space 512 of the exhausting pipe 510, and have ends connected to the protrusion 561a. The elastic members 563 are disposed in the accommodating space 512 to provide elastic force to the driving rods 562. When the plate 540 closes the passage 511, driving force from an external driving part moves the sealing ring 561 downward. The bottom surface of the sealing ring 561 contacts the top surface of the closing region 545 of the plate 540. The sealing ring 561 prevents gas flowing through the passage 511 from leaking to the first and second accommodating spaces 532 and 534, so as to close the passage 511. When the driving force of the external driving part is removed from the sealing ring 561, the elastic force of the elastic members 563 moves the driving rods 562 and the sealing ring 561 upward. Accordingly, the sealing ring 561 is removed from the plate 540. The elastic members 563 may be springs.

Figure 4:
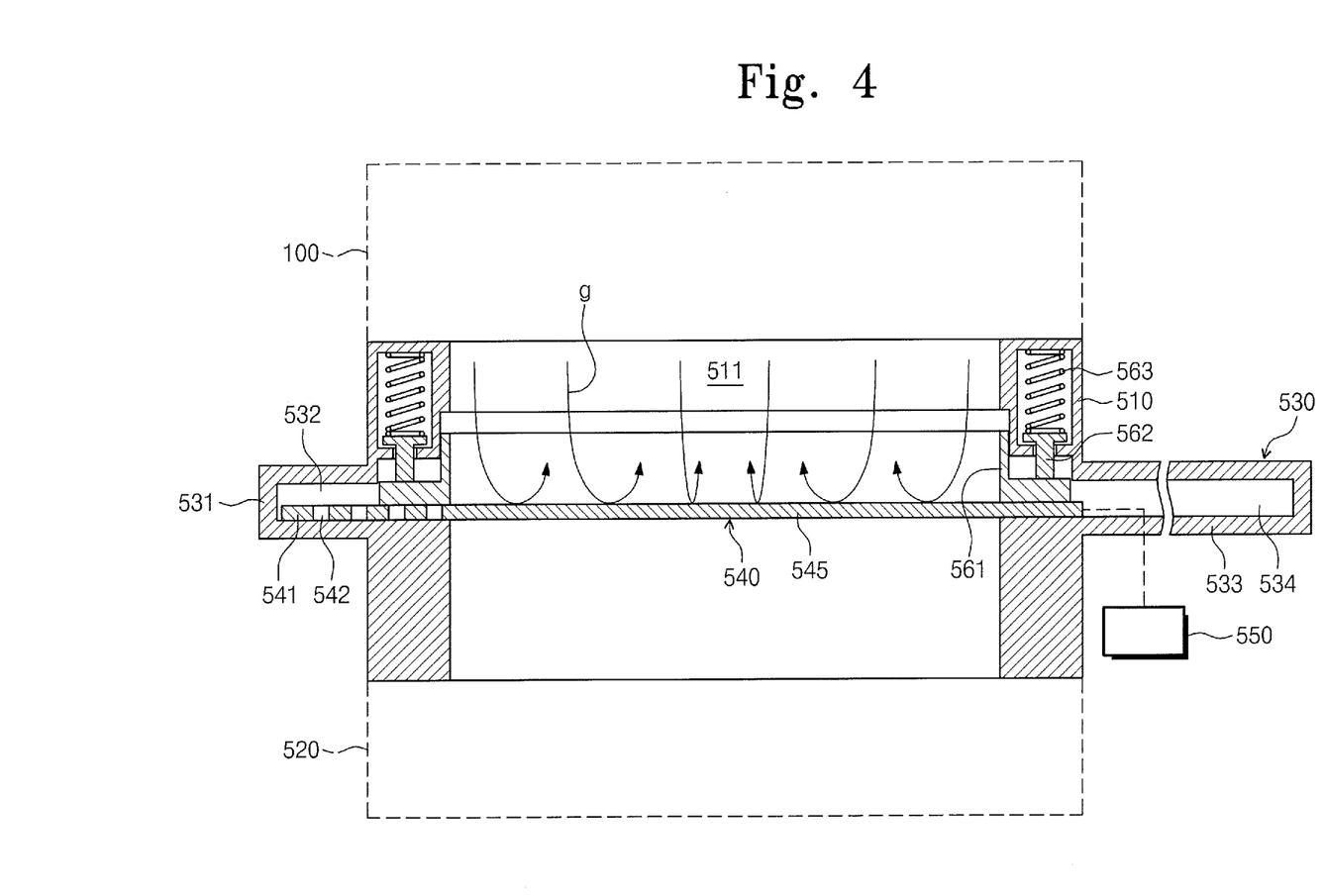
FIG. 4 is a cross-sectional view illustrating a state that a valve closes a passage of an exhausting pipe, according to another embodiment of the present invention.

FIG. 4 is a cross-sectional view illustrating a state that a valve closes a passage of an exhausting pipe, according to another embodiment of the present invention.

Referring to FIG. 4, the driver 550 moves the opening region 541 of the plate 540 to the first accommodating space 532, and the closing region 545 to the passage 511. The external driving part moves the sealing ring 561 downward to contact the plate 540. Accordingly, a gas G is prevented from flowing through the passage 511.

The valve 530 may open at least one portion of the passage 511 according to process pressure conditions. The valve 530 adjusts the degree of opening of the passage 511 to thereby adjust a pressure condition of the process chamber 100.

Figure 5:
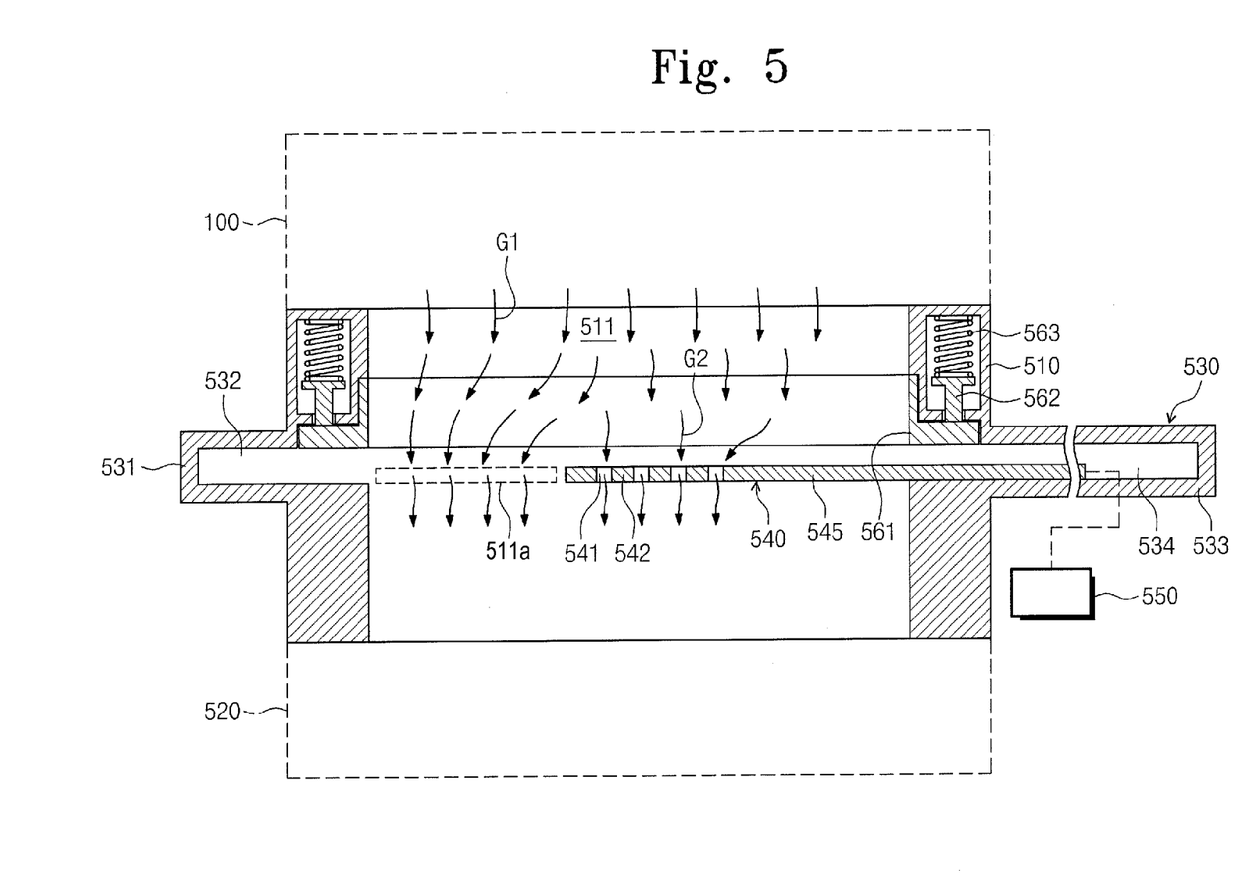
FIG. 5 is a cross-sectional view illustrating a state that a valve opens a passage of an exhausting pipe, according to another embodiment of the present invention.

FIG. 5 is a cross-sectional view illustrating a state that a valve opens a passage of an exhausting pipe, according to another embodiment of the present invention.

Referring to FIG. 5, the driver 550 moves the front end of the plate 540 to the central region of the passage 511 so as to open a portion of the passage 511. At this point, the opening region 541 of the plate 540 is located within the passage 511. A portion G1 of gas flowing through the passage 511 flows through an open region 511a of the passage 511, and the rest of the gas, that is, a gas G2 flows through the exhausting holes 542 in the opening region 541 of the plate 540. Since the gas flows through not only the open region 511a of the exhausting pipe 510 but also the opening region 541 of the plate 540, a gas flow is prevented from being biased to one side within the passage 511. If gas flows through only the open region 511a of the exhausting pipe 510, when gas from the process chamber 100 is introduced into the exhausting pipe 510, a flow of the gas is biased to the open region 511a. This destabilizes a gas flow within the process chamber 100, and thus, a substrate treating result may be varied according to regions on a substrate. However, according to the current embodiment, a gas flow is prevented from being biased to one side within the passage 511. Thus, gas from the process chamber 100 can be uniformly introduced into the exhausting pipe 510.

Hereinafter, a substrate treating method using a substrate treating apparatus as described above will now be described. Referring again to FIG. 2, the atmospheric pressure is maintained within the process chamber 100. To this end, the valve 530 closes the passage 511. Referring to FIG. 4, the driver 550 moves the plate 540 such that the closing region 545 is located within the passage 511. Vacuum pressure from the pump 520 is prevented from being transferred to the process chamber 100 by the plate 540. While the inner pressure of the process chamber 100 is maintained at the atmospheric pressure, the substrate W is transferred into the process chamber 100. Then, the substrate W is supported by the electrostatic chuck 200.

Then, the gas supply part 300 supplies a process gas into the process chamber 100. The valve 530 opens the passage 511 of the exhausting pipe 510. The valve 530 varies the degree of opening of the passage 511 according to process pressure conditions. The valve 530 may fully or partially open the passage 511. According to the opening of the passage 511, the vacuum pressure from the pump 520 is transferred to the process chamber 100 so as to decrease the inner pressure thereof. The antenna 430 supplies high frequency power into the process chamber 100 to excite the process gas to a plasma state. The excited process gas is used to treat the substrate W, and then, is discharged to the outside of the process chamber 100 through the passage 511.

Referring to FIG. 5, when the plate 540 partially opens the passage 511, a portion of the discharged gas flows through the open region 511a of the passage 511, and the rest of the gas flows through the exhausting holes 542 of the plate 540 within the passage 511.

Figure 6:
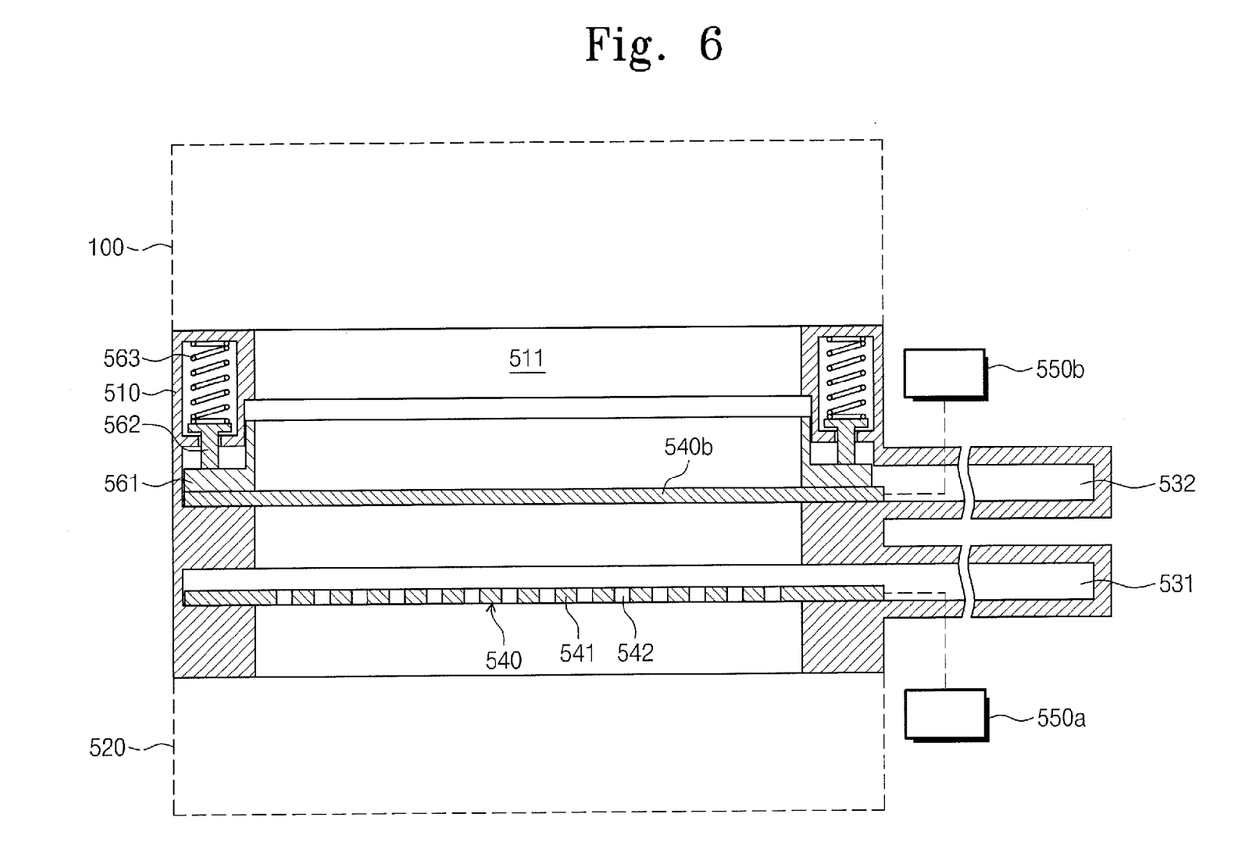
FIG. 6 is a cross-sectional view illustrating an exhausting member according to another embodiment of the present invention.

FIG. 6 is a cross-sectional view illustrating an exhausting member according to another embodiment of the present invention.

Referring to FIG. 6, first and second plates 540a and 540b are installed in an exhausting pipe 510, unlike the valve of FIG. 2. The first plate 540a is disposed within the exhausting pipe 510 between a process chamber 100 and a pump 520. The first plate 540a includes an opening region 541. The opening region 541 has an area corresponding to a passage 511, and exhausting holes 542 are disposed in the opening region 541. The exhausting holes 542 are uniformly distributed in the opening region 541. A first driver 550a moves the first plate 540a such that the opening region 541 is located within the passage 511 or a first accommodating space 531.

The second plate 540b is disposed within the exhausting pipe 510 between the process chamber 100 and the first plate 540a. The second plate 540b has an area greater than that of the passage 511. The exhausting holes 542 are not formed in the second plate 540b. A second driver 550b moves the second plate 540b to the passage 511 or a second accommodating space 532. According to an operation of the second driver 550b, the second plate 540b opens or closes the passage 511.

A sealing ring 561 is disposed above the second plate 540b. When the second plate 540b closes the passage 511, the sealing ring 561 is moved downward to contact the second plate 540b. The sealing ring 561 prevents a gas leak from the passage 511. When the passage 511 is opened, elastic force of elastic members 563 moves the sealing ring 561 upward.

The first and second plates 540a and 540b may open and close the passage 511, or adjust the flow rate of gas discharged through the passage 511.

Referring to FIG. 6, when the second plate 540b is within the passage 511, the passage 511 may be closed. When the first plate 540*a* is located in the first accommodating part 531, and the second plate 540*b* is located in the second accommodating space 532, the passage 511 may be opened.

Figure 7:
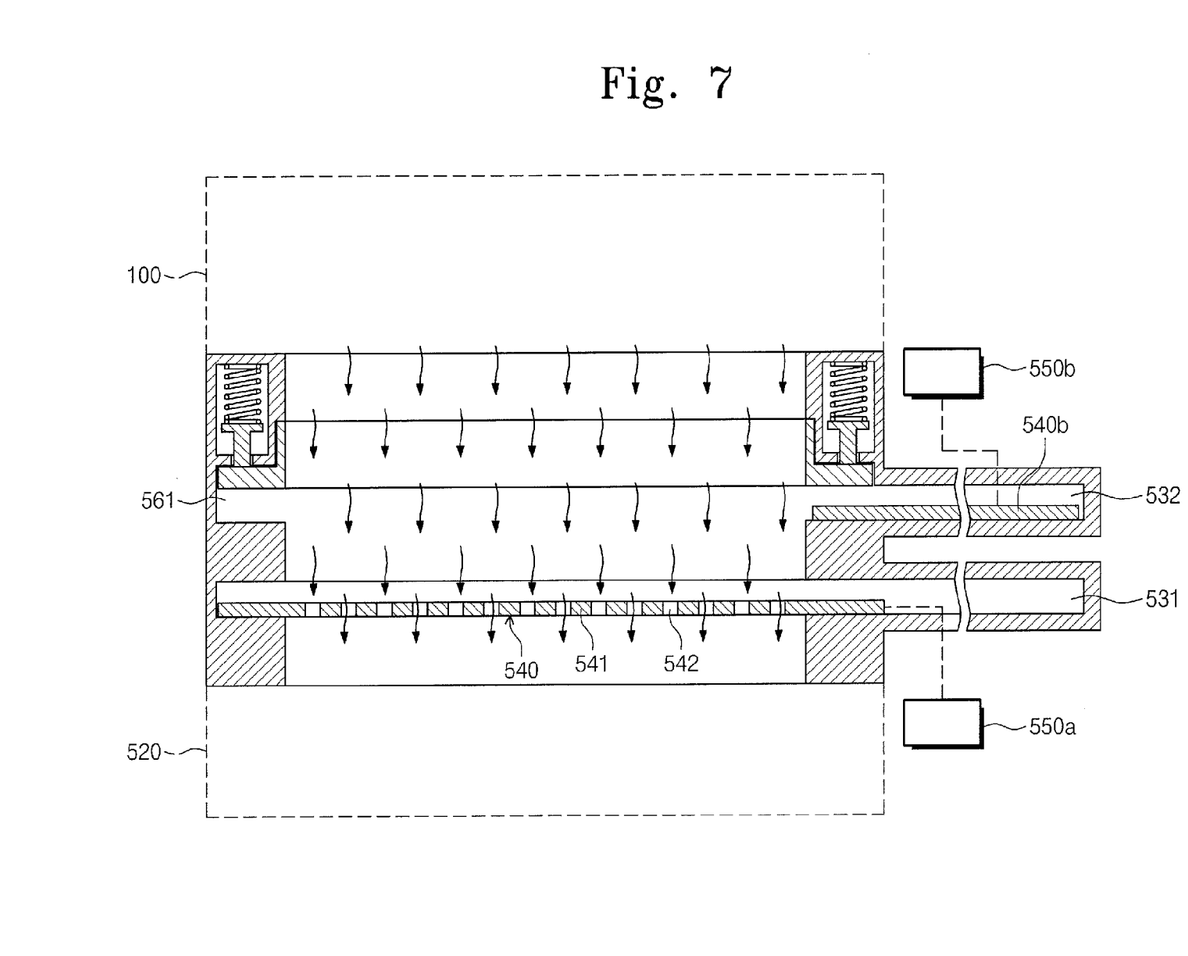
FIG. 7 is a cross-sectional view illustrating a state that a valve of FIG. 6 opens a passage of an exhausting pipe, according to another embodiment of the present invention.

Referring to FIG. 7, when the second plate 540*b* is located in the second accommodating part 532, and the opening region 541 of the first plate 540*a* is located within the passage 511, gas may be discharged through the passage 511. The gas within the passage 511 flows through the exhausting holes 542 in the opening region 541. Since the flow of the gas is uniform across the opening region 541 of the first plate 540*a*, the flow of the gas is prevented from being biased to one side within the passage 511.

A portion of the opening region 541 of the first plate 540*a* may be located in the first accommodating part 531, and the rest thereof may be located within the passage 511, thereby opening a portion of the passage 511. In this case, as illustrated in FIG. 5, a portion of the gas within the passage 511 flows through the open region 511*a* of the passage 511, and the rest thereof flows through the exhausting holes 542, thereby preventing the flow of the gas from being biased to one side.

The plate 540 has an approximately disc shape, but the shape thereof is not limited thereto.

An electrostatic chuck is exemplified as the substrate support part 200, but the substrate support part 200 is not limited thereto. For example, a vacuum chuck may be exemplified as the substrate support part 200, which holds a substrate by using a vacuum.

Although an etching process using plasma is exemplified in the above embodiments, a substrate treating process is not limited thereto, and thus, various substrate treating processes using plasma, such as an ashing process, a depositing process, and a cleaning process, may be exemplified.

According to the embodiments of the present invention, since gas discharged from a process chamber uniformly flows, a substrate can be uniformly treated.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treating apparatus comprising:
    a process chamber providing a space in which a substrate is treated;
    an exhausting pipe connected to the process chamber, and providing a passage through which gas is discharged from the process chamber to an outside thereof, wherein the exhausting pipe and the passage are each disposed below a bottom surface of the process chamber;
    a pump installed on the exhausting pipe; and
    a valve installed on the exhausting pipe between the process chamber and the pump, wherein the valve is configured to open and close the passage for changing an internal pressure within the process chamber, and wherein the valve comprises:
        a first slot-free plate comprising a planar surface area that is symmetrically shaped and extending along a first plane, wherein a second plane that is orthogonal with respect to the first plane bisects the planar surface area into equally sized first and second portions, wherein a plurality of exhausting holes is disposed in the first plate, each of the plurality of exhausting holes comprising a substantially equal diameter, the plurality of exhausting holes being off center with respect to the planar surface area of the first plate and disposed in the first portion of the first plate, wherein the second portion of the first plate is devoid exhausting holes;
        a first driver configured to move the first plate such that at least some exhausting holes of the plurality of exhausting holes are located either within the passage or outside the passage;
        wherein, when the slot-free plate is in a closed position, sealing members comprising at least one sealing ring, a plurality of driving rods, and a plurality of springs bias the slot-free plate in the closed position to prevent leakage of exhaust gas.

2. The substrate treating apparatus of claim 1, wherein a first portion of the plate comprises an opening region in which the plurality of exhausting holes are disposed and wherein a second portion of the plate comprises a closing region extending from the opening region, the closing region being devoid of exhausting holes for blocking a flow of the gas within the passage of the exhausting pipe, and wherein a planar area of the closing region is greater than that of the passage.

3. The substrate treating apparatus of claim 2, wherein the opening region is smaller than the passage.

4. The substrate treating apparatus of claim 1, wherein the valve further comprises a second plate that is disposed within the exhausting pipe between the process chamber and the first plate, for opening and closing the passage, and wherein the second plate is devoid of exhausting holes.

5. The substrate treating apparatus of claim 4, wherein the first plate comprises an opening region having an area that is corresponding in size to the passage, and wherein the exhausting holes are uniformly distributed across the opening region.

6. A substrate treating apparatus comprising:
    a process chamber providing a space in which a substance is treated;
    an exhausting pipe connected to the process chamber, and providing a passage through which gas is discharged from the process chamber to an outside thereof, wherein the exhausting pipe and the passage are each disposed below a bottom surface of the process chamber;
    a pump installed on the exhausting pipe; and
    a valve installed on the exhausting pipe between the process chamber and the pump, wherein the valve is configured to open and close the passage for changing an internal pressure within the process chamber, wherein the valve comprises:
        a first slot-free plate comprising a planar surface area extending along a first plane, wherein a second plane that is orthogonal to the first place bisects the first plate into equally sized first and second portions, wherein a plurality of exhausting holes is disposed in the first portion of the first plate that opposes the second portion of the first plate, each of the plurality of exhausting holes comprising a substantially equal diameter; and
        a first drive configured to move the first plate such that at least some exhausting holes of the plurality of exhausting holes are located either within the passage or outside the passage;
        wherein the first portion of the first plate comprises an opening region in which the plurality of exhausting holes is disposed and wherein the second portion of the first plate comprises a closing region that is devoid of exhausting holes for blocking a flow of the gas within the passage of the exhausting pipe, and wherein the closing region is at least partially disposed over the first portion and the second portion; and wherein, when the slot-free plate is in a closed position, sealing members comprising at least one sealing ring, a plurality of driving rods, and a plurality of springs bias the slot-free plate in the closed position to prevent leakage of exhaust gas.

7. The substrate treating apparatus of claim 6, wherein the opening region is smaller than the passage.

8. The substrate treating apparatus of claim 6, wherein the valve further comprises a second plate that is disposed within the exhausting pipe between the process chamber and the first plate, for opening and closing the passage, and wherein the second plate is devoid of exhausting holes.

9. The substrate treating apparatus of claim 6, wherein the exhausting holes are uniformly distributed across the opening region.

* * * * *